(12) United States Patent
Kaynak et al.

(10) Patent No.: US 10,326,479 B2
(45) Date of Patent: Jun. 18, 2019

(54) APPARATUSES AND METHODS FOR LAYER-BY-LAYER ERROR CORRECTION

(71) Applicant: Micron Technology, Inc., Boise, ID (US)

(72) Inventors: Mustafa N. Kaynak, San Diego, CA (US); Patrick R. Khayat, San Diego, CA (US); Sivagnanam Parthasarathy, Carlsbad, CA (US); Nicholas J. Richardson, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 78 days.

(21) Appl. No.: 15/206,799

(22) Filed: Jul. 11, 2016

(65) Prior Publication Data

US 2018/0013451 A1   Jan. 11, 2018

(51) Int. Cl.
  *H03M 13/45*   (2006.01)
  *G06F 11/10*   (2006.01)
  *G11C 29/52*   (2006.01)
  *H03M 13/11*   (2006.01)
  *H03M 13/29*   (2006.01)
  *H03M 13/37*   (2006.01)
  *G11C 29/04*   (2006.01)
  *H03M 13/15*   (2006.01)

(52) U.S. Cl.
  CPC ....... *H03M 13/458* (2013.01); *G06F 11/1068* (2013.01); *G11C 29/52* (2013.01); *H03M 13/114* (2013.01); *H03M 13/116* (2013.01); *H03M 13/1128* (2013.01); *H03M 13/2906* (2013.01); *H03M 13/2927* (2013.01); *H03M 13/3753* (2013.01); *G11C 2029/0409* (2013.01); *G11C 2029/0411* (2013.01); *H03M 13/152* (2013.01)

(58) Field of Classification Search
  CPC .................................................. H03M 13/458
  See application file for complete search history.

(56) References Cited

U.S. PATENT DOCUMENTS 7,139,960 B2   11/2006   Shokrollahi
7,770,090 B1   8/2010   Kons et al.
8,429,498 B1*  4/2013   Anholt ................ G06F 11/1048
                                                     365/227
8,589,760 B1*  11/2013  Kou ...................... G06F 11/076
                                                     714/763

(Continued)

*Primary Examiner* — Steve N Nguyen
(74) *Attorney, Agent, or Firm* — Brooks, Cameron & Huebsch, PLLC

(57) ABSTRACT

One example of layer-by-layer error correction can include iteratively error correcting the codeword on a layer-by-layer basis with the first error correction circuit in a first mode and determining on the layer-by-layer basis whether a number of parity errors in a particular layer is less than a threshold number of parity errors. The codeword can be transferred to a second error correction circuit when the number of parity errors is less than the threshold number of parity errors. The codeword can be iteratively error corrected with the first error correction circuit in a second mode when the number of parity errors is at least the threshold number of parity errors. The threshold number of parity errors can be at least partially based on an adjustable code rate of the first error correction circuit or the second error correction circuit.

15 Claims, 4 Drawing Sheets

(56) References Cited

U.S. PATENT DOCUMENTS

| | | |
|---|---|---|
| 8,627,167 B1 | 1/2014 | Yang et al. |
| 8,990,661 B1* | 3/2015 | Micheloni ............ H03M 13/112 |
| | | 714/758 |
| 2008/0104474 A1 | 5/2008 | Gao et al. |
| 2009/0094470 A1* | 4/2009 | Gao .................... H03M 13/1128 |
| | | 713/320 |
| 2009/0175387 A1* | 7/2009 | Park ...................... H04L 1/0054 |
| | | 375/340 |
| 2009/0241008 A1 | 9/2009 | Kim et al. |
| 2010/0058125 A1* | 3/2010 | Chen ................... G06F 11/1048 |
| | | 714/704 |
| 2010/0281341 A1* | 11/2010 | Wu ..................... G06F 11/1068 |
| | | 714/763 |
| 2013/0124940 A1* | 5/2013 | Yang ................. H03M 13/1108 |
| | | 714/755 |
| 2014/0153331 A1* | 6/2014 | Jang ..................... G11C 7/1039 |
| | | 365/185.03 |
| 2014/0164867 A1 | 6/2014 | Kaynak et al. |
| 2014/0223255 A1 | 8/2014 | Lu et al. |
| 2016/0246603 A1* | 8/2016 | Watanabe ........... G06F 9/30145 |
| 2016/0299812 A1* | 10/2016 | Olbrich ............... G06F 11/1008 |

\* cited by examiner

APPARATUSES AND METHODS FOR LAYER-BY-LAYER ERROR CORRECTION

TECHNICAL FIELD

The present disclosure relates generally to semiconductor memory and methods, and more particularly, to apparatuses and methods related to layer-by-layer error correction.

BACKGROUND

Memory devices are typically provided as internal, semiconductor, integrated circuits in computers or other electronic devices. There are many different types of memory including volatile and non-volatile memory. Volatile memory can require power to maintain its data (e.g., host data, error information, etc.) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Memory is utilized as volatile and non-volatile data storage for a wide range of electronic applications. Non-volatile memory may be used in portable electronic devices, such as laptop computers, portable memory sticks, digital cameras, cellular telephones, portable music players such as MP3 players, movie players, and other electronic devices. Memory cells can be arranged into arrays, with the arrays being used in memory devices.

One type of error correction involves low density parity check (LDPC) codes. Unencoded (e.g., "raw") data can be encoded into codewords for transmission and/or storage. The codewords can subsequently be decoded to recover the data. Powerful error correction may be desired but balanced against latency, throughput, and/or power constraints such as those imposed by portable electronic devices.

DETAILED DESCRIPTION

Figure 1:
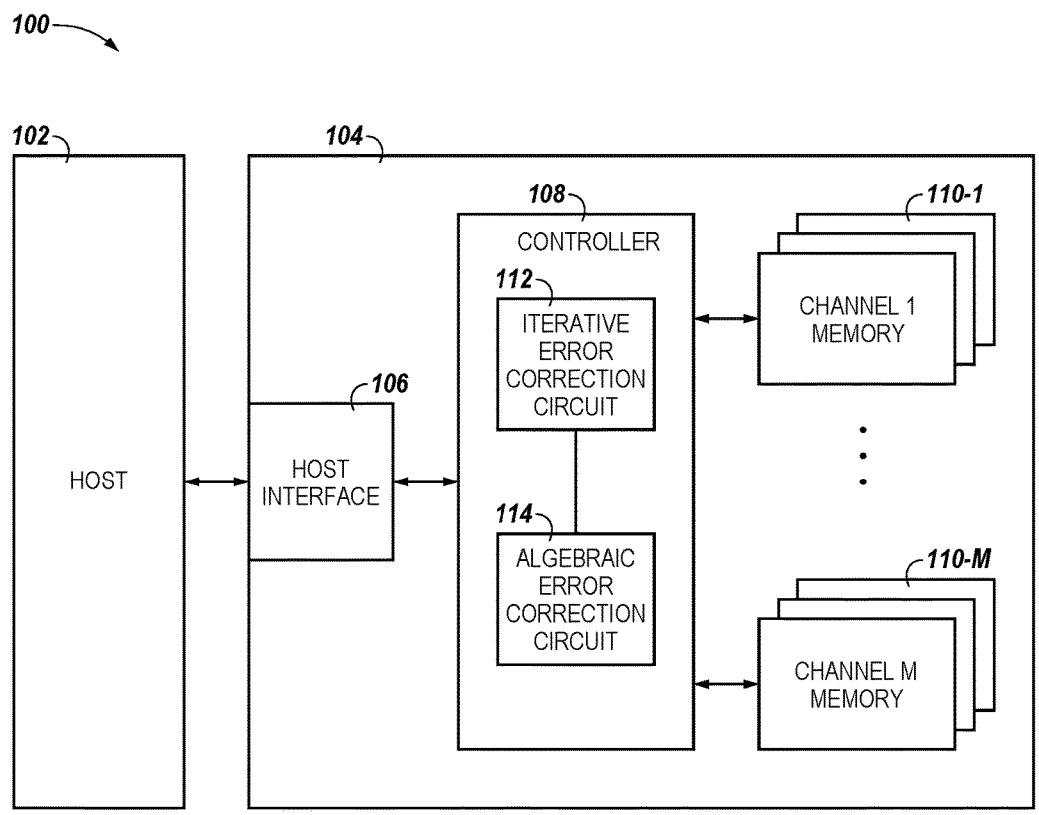
FIG. 1 is a block diagram of an apparatus in the form of a computing system including at least one memory system in accordance with a number of embodiments of the present disclosure.

The present disclosure includes apparatuses and methods related to layer-by-layer error correction for more efficient use of the algebraic error correction circuit and the iterative error correction circuit. The algebraic error correction circuit, in general, uses less energy to correct errors than the iterative error correction circuit. A number of methods can include receiving a codeword with a first error correction circuit, iteratively error correcting the codeword on a layer-by-layer basis with the first error correction circuit in a first mode, and determining on the layer-by-layer basis whether a number of parity errors in a particular layer is less than a threshold number of parity errors. Methods can include transferring the codeword to a second error correction circuit in response to the number of parity errors in the particular layer being less than the threshold number of parity errors and iteratively error correcting the codeword with the first error correction circuit in a second mode in response to the number of parity errors in the particular layer being greater than the threshold number of parity errors.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "M", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including at least one memory system 104 in accordance with a number of embodiments of the present disclosure. As used herein, a memory system 104, a controller 108, or a memory device 110 might also be separately considered an "apparatus." The memory system 104 can be a solid state drive (SSD), for instance, and can include a host interface 106, a controller 108 (e.g., a processing resource and/or other control circuitry), and a number of memory devices 110-1, . . . , 110-M (e.g., solid state memory devices such as a hybrid memory cube (HMC), processing in memory random access memory (PIMRAM) array, DRAM array, SRAM array, STT RAM array, PCRAM array, TRAM array, RRAM array, NAND flash array, and/or NOR flash array), which provide a storage volume for the memory system 104. The number of memory devices 110-1, . . . , 110-M may be referred to generally herein as memory device 110. In another embodiment, the memory system 104 may be a single memory device.

As illustrated in FIG. 1, the controller 108 can be coupled to the host interface 106 and to the memory device 110 via a plurality of channels and can be used to send data between the memory system 104 and a host 102. The host interface 106 can be in the form of a standardized interface. For example, when the memory system 104 is used for data storage in the computing system 100, the host interface 106 can be a serial advanced technology attachment (SATA), peripheral component interconnect express (PCIe), or a universal serial bus (USB), among other connectors and interfaces. In general, however, the host interface 106 can provide an interface for passing control, address, data, and other signals between the memory system 104 and the host 102 having compatible receptors for the interface 106.

The host 102 can be a host system such as a personal laptop computer, a desktop computer, a digital camera, a mobile telephone, or a memory card reader, among various other types of hosts. The host 102 can include a system motherboard and/or backplane and can include a number of memory access devices (e.g., a number of processors). The host 102 can also be a memory controller, such as where the memory system 104 is a memory device (e.g., having an on-die controller).

The controller 108 can communicate with the memory device 110 (which in some embodiments can be a number of memory arrays on a single die) to control data read, program verify, write, and erase operations, among other operations. In some embodiments, the controller 108 can be on the same die or a different die than any or all of the number of memory devices 110-1, . . . , 110-M.

Although not specifically illustrated, in some embodiments, the controller 108 can include a discrete memory channel controller for each channel coupling the controller 108 to the number of memory devices 110-1, . . . , 110-M. Each of the number of memory devices 110-1, . . . , 110-M can be associated with a memory channel. The controller 108 can include, for example, a number of components in the form of hardware and/or firmware (e.g., one or more integrated circuits) and/or software for controlling access to the number of memory devices 110-1, . . . , 110-M and/or for facilitating data transfer between the host 102 and the number of memory devices 110-1, . . . , 110-M.

The number of memory devices 110-1, . . . , 110-M can include a number of arrays of memory cells (e.g., non-volatile memory cells). The arrays can be flash arrays such as a hybrid memory cube (HMC), processing in memory random access memory (PIMRAM) array, DRAM array, SRAM array, STT RAM array, PCRAM array, TRAM array, RRAM array, NAND flash array, and/or NOR flash array. However, embodiments are not limited to a particular type of memory array or array architecture. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In operation, data can be written to and/or read from memory (e.g., the number of memory devices 110-1, . . . , 110-M of the memory system 104) as a page of data, for example. As such, a page of data can be referred to as a data transfer size of the memory system. Data can be transmitted to/from a host (e.g., the host 102) in data segments referred to as sectors (e.g., host sectors). As such, a sector of data can be referred to as a data transfer size of the host.

As illustrated in FIG. 1, the controller 108 can include a first error correction circuit (e.g., an iterative error correction circuit 112) coupled to a second error correction circuit (e.g., an algebraic error correction circuit 114). The iterative error correction circuit 112 can be a layered iterative error correction circuit. A write path for data can begin at the host interface 106 (e.g., receiving data from the host 102), then to the algebraic error correction circuit 114 (e.g., encoding the data according to an algebraic error correction code), then to the iterative error correction circuit 112 (e.g., encoding the algebraic error correction encoded data according to an iterative error correction code), and then to the memory device 110 (e.g., writing the iterative error correction encoded data to the memory device 110). A read path for data can begin at the memory device 110 (e.g., reading the iterative error correction encoded data from the memory device 110), then to the iterative error correction circuit 112 (e.g., decoding the iterative error correction encoded data), then to the algebraic error correction circuit 114 (e.g., decoding the algebraic error correction encoded data), and then to the host interface 106 (e.g., transmitting data to the host 102). Another read path can begin at the memory device 110, then to the algebraic error correction circuit 114, then to the iterative error correction circuit 112, and then to the host interface 106. Other read paths can include either the iterative error correction circuit 112 or the algebraic error correction circuit 114 only.

The iterative error correction circuit 112 can be a quasi-cyclic low density parity check (LDPC) code circuit, among other iterative error correction circuits that apply layered iterative error correction. For example, the iterative error correction circuit 112 can be configured to decode a LDPC code. Although illustrated as a single circuit, the iterative error correction circuit 112 can be provided as a separate encoding circuit (e.g., for encoding data to be stored in the memory device 110) and decoding circuit (e.g., for decoding data stored in the memory device 110). The algebraic error correction circuit 114 can be one of the group including a Bose-Chaudhuri-Hocquenghem (BCH) error correction circuit, and a Reed Solomon error correction circuit, among other algebraic error correction circuits. For example, the algebraic error correction circuit 114 can be configured to decode an algebraic code. Although illustrated as a single circuit, the algebraic error correction circuit 114 can be provided as a separate encoding circuit (e.g., for encoding data to be stored in the memory device 110) and decoding circuit (e.g., for decoding data stored in the memory device 110). Each of the iterative error correction circuit 112 and the algebraic error correction circuit 114 can be discrete components such as an application specific integrated circuit (ASIC) or the components may reflect functionally provided by circuitry within the controller 108 that does not necessarily have a discrete physical form separate from other portions of the controller 108. Although illustrated as components within the controller 108 in FIG. 1, each of the iterative error correction circuit 112 and the algebraic error correction circuit 114 can be external to the controller 108 or have a number of components located within the controller 108 and a number of components located external to the controller 108.

The iterative error correction circuit 112 can be configured to receive a codeword from the memory device 110. In a number of embodiments, the iterative error correction circuit 112 can receive the codeword, which can be comprised of hard data read from the memory device 110, without receiving soft data. In a number of embodiments, the iterative error correction circuit 112 can receive the codeword comprising hard data and can receive soft data corresponding to the codeword therewith. In a number of embodiments, the iterative error correction circuit 112 can receive the codeword comprising hard data and can separately receive soft data corresponding to the codeword (e.g., where the soft data is received based on a separate soft read of the codeword or where the soft data was originally read with the hard data, buffered, and received from the buffer). Hard data is data that corresponds to the data state of a memory cell. For example, a 2-bit memory cell can be programmed to one of four data states, where each data state corresponds to one of 00, 01, 10, or 11. In contrast, soft data associated with a memory cell can indicate a location of a charge within a distribution of charges (e.g., threshold voltage (Vt) distribution) representing the target state to which the memory cell was programmed. Soft data corresponding to a codeword, where the codeword is comprised of hard data, can indicate a greater resolution of the hard data in the codeword. A memory device can be configured to determine a particular number of soft data bits for hard data read therefrom. For the 2-bit memory cell described above, an example of soft data could include a greater resolution that uses four bits, which could otherwise represent up to sixteen different states. The resolution of the soft data can depend on the number of reads made to locate the charge stored on the memory cell for those embodiments employing discrete read signals, where more reads can provide greater resolution. For those embodiments employing a ramping read signal, the resolution of the soft data can depend on a resolution provided as an output from an analog-to-digital converter or other circuitry that correlates a value of the charge of the memory cell to data, where the resolution is reflected by the number of bits transmitted across an input/output (I/O) bus from the memory device 110. For example, a memory device 110 can be configured to read a particular memory cell that stores two bits of data with a resolution of eight bits and to transfer anywhere from two bits (two bits of hard data and zero bits of soft data) to eight bits (two bits of hard data and six bits of soft data) across an I/O bus.

The iterative error correction circuit 112 can iteratively error correct the codeword by parity checking the codeword on a layer-by-layer basis. One iteration of error correction performed by the iterative error correction circuit 112 can include more than one parity checking layer. For example, a codeword of length "N" data units comprising "K" user data units, "N−K" parity data units, and "L" layers can have "(N−K)/L" parity checks per layer. Each unit of the codeword can be checked against one parity check after one layer. After "L" layers have been error corrected, one iteration of error correction can be completed. The iterative error correction circuit 112 can use an iterative belief propagation decoder, where the iterative error correction circuit 112 can include two types of processing nodes: variable nodes and check nodes. The processing nodes can be coupled according to the LDPC code's parity check matrix.

The check nodes can be implemented as circuits that parity check (e.g., perform a syndrome check). For embodiments that include receiving hard data without soft data and/or reliability data (e.g., based on hard data reads), reliability data can be assigned to the codeword based, at least in part, on the LDPC code's parity check constraints during the decoding process. For embodiments that include receiving hard data with soft data (e.g., based on soft data reads), the reliability data can be assigned to the codeword based, at least in part, on the soft data (e.g., the input to the iterative error correction circuit 112 will include reliability data, unlike the hard read case).

The iterative error correction circuit 112 can transfer the codeword, or a copy thereof, to the algebraic error correction circuit 114 in response to a layer having a number of parity errors less than a threshold number of parity errors. For example, the threshold number of parity errors can be selected based on the correction capability of the algebraic error correction circuit 114. In a number of embodiments, the controller 108 can be configured to select the threshold number of parity errors based on a number of characteristics of the memory device 110, such as a temporal age of the memory device 110, a number of program/erase cycles of the memory device 110, a storage density of the memory device 110, a retention rate of the memory device 110 (e.g., how long programmed memory cells can retain a charge), and/or a physical location within the memory device 110 where the codeword is stored (e.g., whether the codeword, or a portion thereof is stored on an edge word line), among other characteristics of the memory device 110. In some embodiments, the threshold number of parity errors can be defined in firmware of the controller 108 as a selectable option.

The iterative error correction circuit 112 and/or the algebraic error correction circuit 114 each can be configured to error correct a codeword with an adjustable parity overhead. A codeword can have a total size that includes a payload and one or more corresponding parity units. The codeword payload can refer to the data (e.g., user data) that is encoded within the codeword. The one or more corresponding parity units can refer to the error data that is encoded in the codeword along with the payload to protect the payload. The adjustable parity overhead can be controlled by adjusting the code rates used by the iterative error correction circuit 112 and/or the algebraic error correction circuit 114. As used herein, "code rate" refers to a ratio of the size of the payload to the size of the codeword. For example, a code rate "m/n" can refer to "m" user data units encoded within a codeword of size "n" such that the codeword comprises "n−m" parity units. To achieve a higher parity overhead, a lower code rate can be used such that for each data unit has an increased number of corresponding parity units. Conversely, to achieve a lower parity overhead, a higher code rate can be used such that for each data unit has a decreased number of corresponding parity units.

The code rates for the iterative error correction circuit 112 and the algebraic error correction circuit 114 can be adjusted, individually or in tandem, to more efficiently work with a particular RBER distribution that corresponds to the bit error rate of the memory. RBER can depend on several factors, including but not limited to, program/erase cycles, retention, and/or interference/disturb mechanisms. RBER can also be subject to die-to-die, block-to-block, and/or page-to-page variation. For example, if an average RBER for a technology node is relatively low, then a higher parity overhead for the algebraic error correction circuit 114 can be used relative to the parity overhead for the iterative error correction circuit 112. In contrast, if an average RBER for a technology node is relatively high, then a higher parity overhead for the iterative error correction circuit 112 can be used relative to the parity overhead for the algebraic error correction circuit 114. As used herein, "technology node" refers to characteristics of a memory device such as feature size (e.g., 90 nanometers), memory type (e.g., flash, phase change, etc.), or other characteristics that can affect the performance and/or reliability of the memory, but is distinguished from a number of bits stored per cell. Code rate selection can occur before a memory device (e.g., the memory device 110) starts operating or on the fly while the memory device is operating.

Adjusting code rates to more efficiently work for a particular RBER distribution can be beneficial in a memory device comprising various technology nodes or multi-level memory cells (MLCs). As used herein, MLC refers to a memory cell configured to store more than one data unit (e.g., more than one bit per memory cell). As the number of units of data stored in a single memory cell increases, the initial (e.g., time zero) RBER of a memory device will also increase.

A tail of a RBER distribution can be analyzed to determine how far the tail reaches for a particular program/erase (P/E) cycle, retention, or other performance and reliability requirements. A worst case RBER can be used to determine a code rate for the iterative error correction circuit 112 because a RBER tail event, which can be rare, can be corrected by the iterative error correction circuit 112 using soft data, as described above. In another example where a memory device is limited to using a fixed spare page size for parity data, the algebraic error correction circuit 114 can use a higher code rate to account for the fixed spare page size. In contrast, a memory device that can use more than a spare page size for error correction, then the average RBER can be analyzed to determine a code rate for the algebraic error correction circuit 114 that will account for a significant number of P/E cycles thereby limiting the use of error correction methods that use more power (e.g., the iterative error correction circuit 112) to RBER tail events.

In some embodiments, the iterative error correction circuit 112 can error correct the codeword until the codeword includes less than a threshold number of parity errors in a particular layer of a particular iteration. The particular layer can be a fraction other than a last fraction of a particular iteration. According to a number of embodiments, a concatenated coding scheme can be employed such that the algebraic error correction circuit 114 can receive the codeword from the iterative error correction circuit 112 (e.g., after the codeword includes less than a threshold number of parity errors in a particular layer). Then the algebraic error correction circuit 114 can error correct the codeword according to its algebraic error correction code constraints. The algebraic error correction circuit 114 can be configured to transfer the codeword, or a copy thereof, to the host interface 106 (and the host interface can be configured to receive the codeword) in response to a successful error correction by the algebraic error correction circuit 114. The controller 108 can be configured to indicate a successful read operation in response to a successful error correction by the algebraic error correction circuit 114. In the event that the error correction by the algebraic error correction circuit 114 is unsuccessful, the iterative error correction circuit 112 can be configured to receive soft data from the memory device 110 (e.g., from a soft read of the memory or from a buffer that stores previously read soft data) in response to the unsuccessful error correction by the algebraic error correction circuit 114 (e.g., the controller 108 can initiate a soft read and/or request soft data that was previously read along with the hard data).

In some embodiments, the iterative error correction circuit 112 can be configured to operate in two modes. The iterative error correction circuit 112 can use a different error correction parameter (e.g., decoding parameter) in a first mode than in a second mode. The different error correction parameter can include, but is not limited to, a number of iterations of performed in each mode, a set of parameters for a min-sum algorithm, and/or an offset. In a first mode (e.g., low-effort LDPC decoding (LE-LCD)), the iterative error correction circuit 112 can run a first number of iterations. For example, the iterative error correction circuit 112 in the first mode can run only two iterations. The iterative error correction circuit 112 in the first mode can use a first set of parameters for a min-sum algorithm. In a second mode (e.g., high-effort LDPC decoding (HE-LCD)), the first error correction circuit 112 can run a second number of iterations. The iterative error correction circuit 112 in the second mode can use a second set of parameters for a min-sum algorithm. The decoder internal precision for the first mode can be lower than the internal precision of the second mode. The second number of iterations can be greater than the first number of iterations. Additionally, the iterative error correction circuit 112 in the second mode can receive soft data, as described above, such that near channel capacity performance can be approached.

The iterative error correction circuit 112 can deliver iteration savings over a number of iterations (e.g., iterations of a normalized-min-sum or other iterative decoding algorithm). An iteration of an iterative error correction circuit 112 can be equivalent to going over all parities. However, the amount of power consumed by the iterative error correction circuit 112 is directly proportional to the number of iterations performed. Given the stringent power budget of some memory systems (e.g., systems employing flash memory such as in portable electronic devices), a number of embodiments of the present disclosure stop the iterative error correction circuit 112 prior to completing all iterations (yielding iteration savings), or even prior to completing a particular iteration. Furthermore, a concatenated coding scheme is employed that uses both the iterative error correction circuit 112 (e.g., providing an inner code) and the algebraic error correction circuit 114 (e.g., providing an outer code). Given that the iterative error correction circuit 112 and the algebraic error correction circuit 114 both work to correct a codeword, stopping the iterative error correction circuit 112 as soon as the residual parity errors are suspected to be within the correction capability of the algebraic error correction circuit 114 can be beneficial in terms of power and energy savings. Error correction of the codeword can begin with the algebraic error correction circuit 114 in response to stopping iterative error correction with the iterative error correction circuit 112 (e.g., when a particular layer has less than a threshold number of parity errors). However, in a number of embodiments, the iterative error correction circuit 112 can continue to iteratively error correct the codeword while the algebraic error correction circuit 114 error corrects the codeword. In such embodiments, the iterative error correction circuit 112 can be stopped in response to the second error correction circuit reporting successful error correction of the codeword. In response to the algebraic error correction circuit 114 reporting an uncorrectable error, the iterative error correction circuit 112 can be configured to continue iteratively error correct the codeword until the codeword is successfully error corrected or a maximum number of iterations of error correction has been performed.

By way of example, the iterative error correction circuit 112 can comprise an LDPC decoder that employs a layered min-sum decoding algorithm, where a layer can be considered a fraction of an iteration. If such a layer results in less than a threshold number of parity errors, an assumption can be made that the codeword will be within an error correction capability of the algebraic error correction circuit 114.

Figure 2:
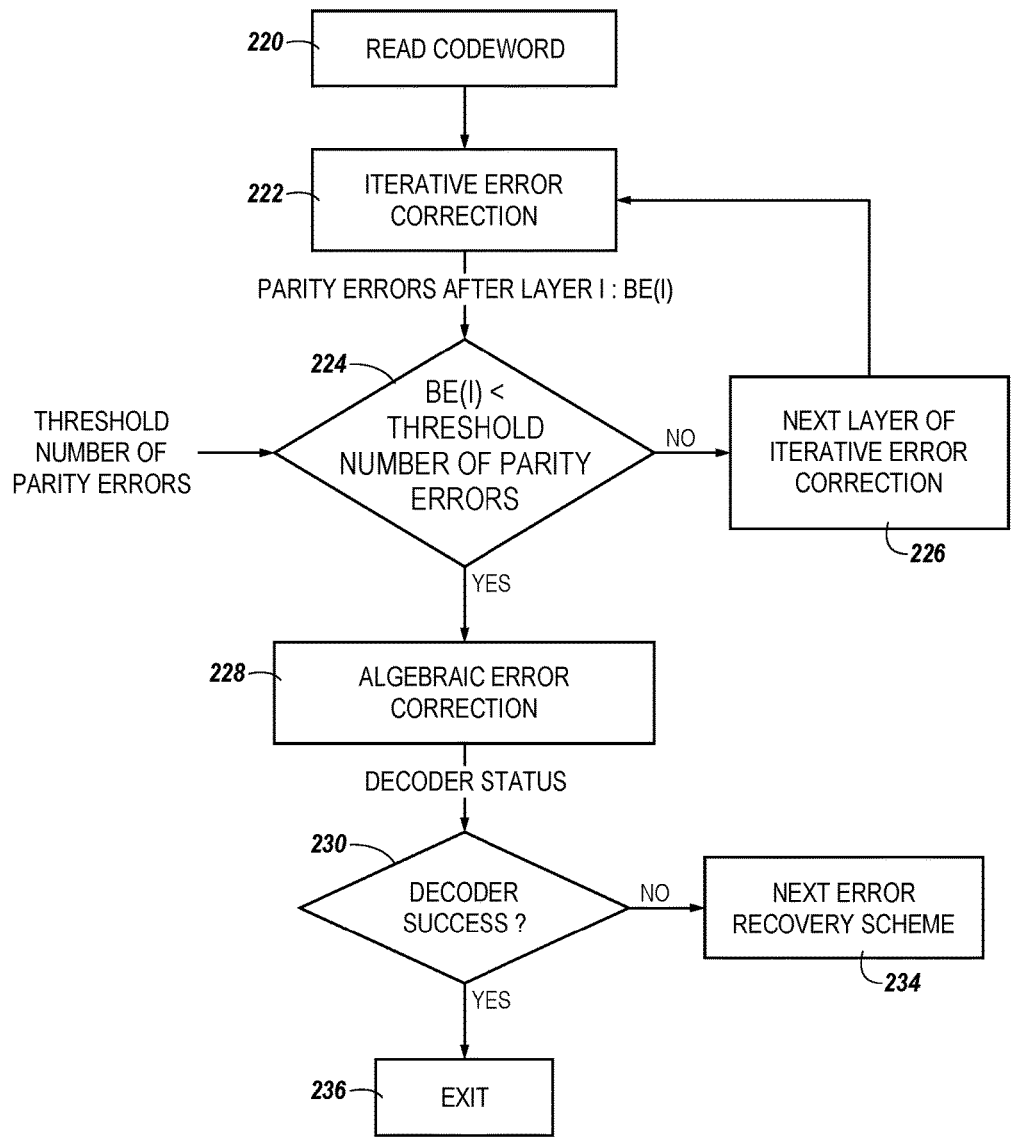
FIG. 2 illustrates a flow diagram for layer-by-layer error correction in accordance with a number of embodiments of the present disclosure.

FIG. 2 illustrates a flow diagram for layer-by-layer iterative error correction in accordance with a number of embodiments of the present disclosure where the hard data is received by iterative error correction circuitry instead of algebraic error correction circuitry. At 220, a codeword comprising hard data can be received from a memory device (e.g., a memory device 110 illustrated in FIG. 1). At 222, iterative error correction (e.g., decoding) can be performed on the codeword on a layer-by-layer basis with a first error correction circuit (e.g., an iterative error correction circuit 112 illustrated in FIG. 1). After each layer of error correction, the first error correction circuit can be aware of the number of parity errors in that layer (e.g., BE(1)). At 224, if the number of parity errors in a layer of the codeword is greater than or equal to (e.g., at least) a threshold number of parity errors, then a next layer of iterative error correction, at 226, can be performed by the first error correction circuit at 222. Although not specifically illustrated in FIG. 2, the iterative error correction at 222 can be stopped in response to a threshold number of iterations being completed (regardless of whether the parity check is correct for a last layer of a last iteration of error correction).

At 224, if the number of parity errors is less than a threshold number of parity errors then the codeword can be transferred to a second error correction circuit (e.g., an algebraic error correction circuit 114 illustrated in FIG. 1) at 228. The codeword can be autonomously transferred from the first error correction circuit to the second error correction circuit (e.g., via hardware only). The threshold number of parity errors can be based on the correction capability of an algebraic error correction circuit (e.g., the algebraic error correction circuit 114). The iterative error correction can be stopped (without checking a next layer of the iteration) in response to the codeword being transferred at 228.

At 230, after the second error correction circuit has error corrected (e.g., decoded) the codeword, a determination can be made as to whether the error correction was successful. If the error correction with the second error correction circuit was not successful, then, at 234, a different recovery scheme (e.g., corrective read, read-retry, and target read level calibration) can be deployed. If the error correction with the second error correction circuit was successful, at 236, the error correction process can be exited. The codeword can be output to the host, for example, in response to successful error corrections by the first and the second error correction circuits.

Figure 3:
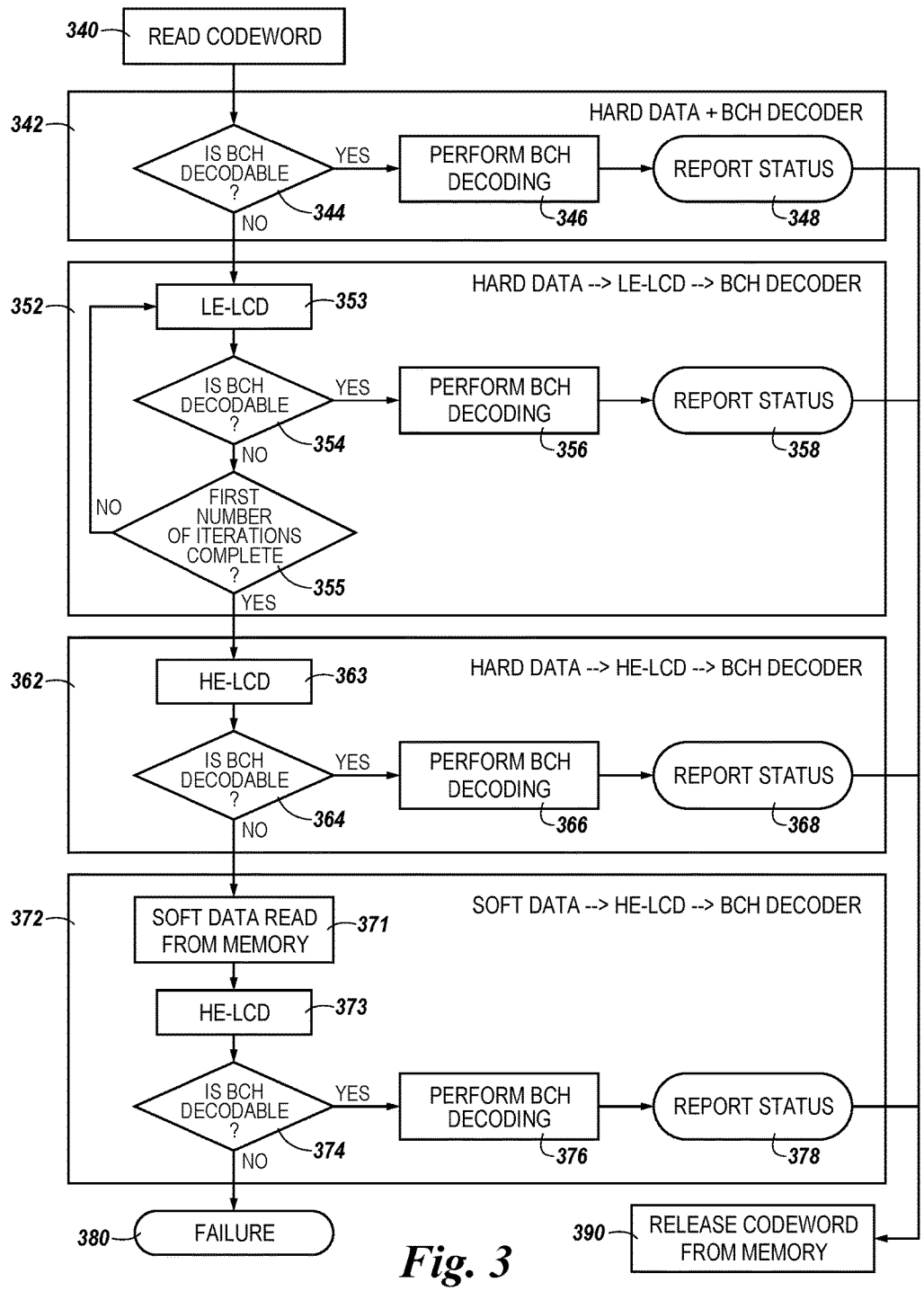
FIG. 3 illustrates a flow diagram for multi-stage error correction in accordance with a number of embodiments of the present disclosure.

FIG. 3 illustrates a flow diagram for multi-stage error correction in accordance with a number of embodiments of the present disclosure. A first stage of error correction 342 can include an initial determination whether a codeword is error correctable by a second error correction circuit (e.g., a BCH error correction circuit). In the event that a codeword is not error correctable by the second error correction circuit, a second stage of error correction 352 can be employed.

The second stage of error correction 352 can include error correcting the codeword on a layer-by-layer basis with a first error correction circuit (e.g., a LDPC error correction circuit) in a first mode. A determination whether the codeword is error correctable by the second error correction circuit can be made after error correcting a layer of the codeword with the first error correction circuit in the first mode. In the event that the codeword is not error correctable by the second error correction circuit and the first error correction circuit in the first mode, a third stage of error correction 362 can be employed.

The third stage of error correction 362 can include error correcting the codeword with the first error correction circuit in a second mode. A determination whether the codeword is error correctable by the second error correction circuit can be made after error correcting the codeword with the first error correction circuit in the second mode. In the event that the codeword is not error correctable by the second error correction circuit and the first error correction circuit in the second mode, a fourth stage of error correction 372 can be employed.

The fourth stage of error correction 372 can include error correcting the codeword with the first error correction circuit in the second mode with soft data corresponding to the codeword. A determination whether the codeword is error correctable by the second error correction circuit can be made after error correcting the codeword with the first error correction circuit in the second mode with the soft data. In the event that the codeword is not error correctable by the second error correction circuit and the first error correction circuit in the second mode with soft data, an error correction failure can be reported and another error recovery scheme can be deployed.

The following is a description of the individual steps of the multi-stage error correction illustrated in FIG. 3. At 340, a codeword comprising hard data can be received from a memory device (e.g., the memory device 110 illustrated in FIG. 1) to the second error correction circuit. The first stage of error correction 342 can begin at 344, where a determination whether the codeword is error correctable by the second error correction circuit (e.g., BCH decodable) can be made before performing the error correction at 346. The determination can be made by the first error correction circuit, the second error correction circuit, or the first error correction circuit in tandem with the second error correction circuit. For example, the first error correction circuit can determine an initial number of parity errors in the codeword. At 344, if the initial number of parity errors is less than a threshold number of parity errors, then the codeword can be error corrected with the second error correction circuit (e.g., BCH decoding) at 346. At 348, the status of the error correction (e.g., success or failure) can be reported, for example, to a controller (e.g., a controller 108 illustrated in FIG. 1) or to a host (e.g., a host 102 illustrated in FIG. 1). At 390, the codeword can be released from a memory cache (e.g., controller memory) in response to successful error corrections by the second error correction circuit. At 344, if the initial number of parity errors is at least a threshold number of parity errors, then the process can continue to the second stage of error correction 352.

At 353, the codeword can be received by the first error correction circuit. At 353, iterative error correction can be performed on the codeword on a layer-by-layer basis with the first error correction circuit in a first mode (e.g., low-effort LDPC decoding (LE-LCD)). The first mode can include iteratively error correcting the codeword on the layer-by-layer basis with the first error correction circuit for a first number of iterations. At 354, a determination whether the codeword is error correctable by the second error correction circuit (e.g., BCH decodable) can be made. For example, after each layer of error correction, the first error correction circuit can be aware of the number of parity errors remaining in that layer. At 354, if after error correction with the first error correction circuit in the first mode a first layer includes less than a threshold number of parity errors, then the codeword can be transferred to the second error correction circuit for error correction (e.g., BCH decoding) at 356. The codeword can be autonomously transferred from the first error correction circuit to the second error correction circuit (e.g., via hardware only). The threshold number of parity errors can be based on the correction capability of the second error correction circuit. The iterative error correction with the first error correction circuit in the first mode at 353 can be stopped without checking a next layer of the iteration or completing the first number of iterations in response to the codeword being transferred to the second error correction circuit at 356. At 358, the status of the error correction (e.g., success or failure) can be reported, for example, to the controller or to the host. At 390, the codeword can be released from a controller memory (e.g., cache) in response to successful error corrections by the second error correction circuit.

At 354, if after error correction with the first error correction circuit in the first mode the first layer includes the threshold number of parity errors (e.g., not BCH decodable), the process can continue to 355 where a determination whether the first number of iterations has been completed can be made. At 355, if the first number of iterations has not been completed, then a next layer of iterative error correction can be performed with the first error correction circuit in the first mode at 353. At 355, if the first number of iterations has been completed, then the process can continue to the third stage of error correction 362.

At 363, iterative error correction can be performed on the codeword with the first error correction circuit in a second mode (e.g., high-effort LDPC decoding (HE-LCD)). The first error correction circuit can be autonomously switched from the first mode to the second mode without firmware intervention or a re-read of the codeword from the memory device. The second mode can include iteratively error correcting the codeword with the first error correction circuit for a second number of iterations. The second number of iterations can be greater than the first number of iterations.

At 364, a determination whether the codeword is error correctable by the second error correction circuit (e.g., BCH decodable) can be made. For example, the first error correction circuit can be aware of the number of parity errors remaining in a second layer. At 364, if after error correction with the first error correction circuit in the second mode the second layer of the codeword includes less than the threshold number of parity errors, then the codeword can be transferred to the second error correction circuit for error correction (e.g., BCH decoding) at 366. The codeword can be autonomously transferred from the first error correction circuit to the second error correction circuit (e.g., via hardware only). The iterative error correction with the first error correction circuit in the second mode at 363 can be stopped without checking a next layer of the iteration or completing the second number of iterations in response to the codeword being transferred to the second error correction circuit at 366. At 368, the status of the error correction (e.g., success or failure) can be reported, for example, to the controller or to the host. At 390, the codeword can be released from a controller memory (e.g., cache) in response to successful error corrections by the second error correction circuit.

At 364, if after error correction with the first error correction circuit in the second mode, the second layer includes the threshold number of parity errors (e.g., not BCH decodable), the process can continue to the fourth stage of error correction 372.

At 371, soft data can be read from the memory device corresponding to the codeword. The soft data can be received by the first error correction circuit in response to failed error corrections by the first error correction circuit and the second error correction circuit as described above. At 373, iterative error correction can be performed on the codeword on with the first error correction circuit in the second mode (e.g., HE-LCD) with the soft data. At 374, if after error correction with the first error correction circuit in the second mode with the soft data a third layer of the codeword includes less than the threshold number of parity errors (e.g., BCH decodable), then the codeword can be transferred to the second error correction circuit for error correction (e.g., BCH decoding) at 376. The codeword can be autonomously transferred from the first error correction circuit to the second error correction circuit (e.g., via hardware only). The iterative error correction with the first error correction circuit in the second mode at 373 can be stopped (without checking a next layer of the iteration) in response to the codeword being transferred to the second error correction circuit at 376. At 378, the status of the error correction (e.g., success or failure) can be reported, for example, to the controller or to the host. At 390, the codeword can be released from a controller cache in response to successful error corrections by the second error correction circuit.

At 374, if after error correction with the first error correction circuit with the soft data the third layer includes the threshold number of parity errors (e.g., not BCH decodable), then at 380 an error correction failure can be reported, for example, to firmware such that other recovery schemes (e.g., corrective read, read-retry, and target read level calibration) can be deployed.

The multi-stage error correction illustrated in FIG. 3 can be beneficial in the event of miss-detection. As used herein, "miss-detection" refers to when iterative error correction of a codeword with a first error correction circuit is stopped and the codeword is transferred to a second error correction circuit (in response to a number of parity errors in a layer of the codeword being less than a threshold number of parity errors) even though the number of residual errors in the codeword are more than the correction capability of the second error correction circuit. The probability of miss-detection can be decreased by using a smaller threshold number of parity errors (e.g., a lesser number of parity errors in a layer). However, this can result in more error correction iterations run by the first error correction circuit, which in turn can require more power. The multi-stage error correction illustrated in FIG. 3 can allow a larger threshold number of parity errors to be used, which can result in higher power savings at the expense of a higher probability of miss-detection. The third and fourth stages of error correction 362 and 372 can provide increased error correction capability such that a higher probability of miss-detection is allowable.

Although FIG. 3 shows LDPC iterative error correction being performed by a first error correction circuit, any iterative error correction can be performed by the first error correction circuit. Similarly, although FIG. 3 shows BCH algebraic error correction being performed by a second error correction circuit, any algebraic error correction can be performed by the second error correction circuit.

Although FIG. 3 only shows the second stage of error correction 352 including a layer-by-layer determination whether the codeword is error correctable by the second error correction circuit (e.g., BCH decodable) following iterative error correction with the first error correction circuit in the first mode such that if the codeword is not error correctable by the second error correction circuit (e.g., not BCH decodable) a next layer of an iteration is error correction with the first error correction circuit in the first mode, the third and fourth stages of error correction 362 and 372 can also include a layer-by-layer determination whether the codeword is error correctable by the second error correction circuit (e.g., BCH decodable) following each stage's respective iterative error correction. Although not specifically illustrated in FIG. 3, the iterative error correction (e.g., at 353, 363 or 373) can be stopped in response to a threshold number of iterations being completed (regardless of whether the parity check is correct for a last layer of a last iteration of error correction). Although the multi-stage error correction illustrated in FIG. 3 shows four stages of error correction 342, 352, 362, and 372, embodiments are not so limited. For example, a number of embodiments in accordance with the present disclosure can employ a subset of the four stages illustrated in FIG. 3 (e.g., the second and third stages 352 and 362 only).

Figure 4:
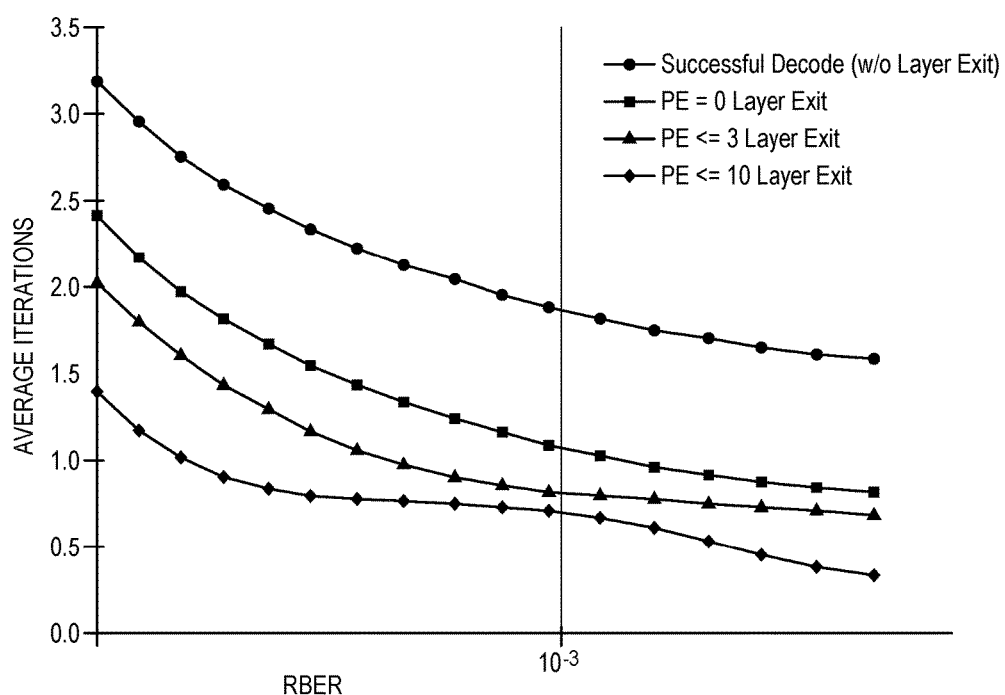
FIG. 4 is a plot illustrating average iterations of layered iterative error correction versus raw bit error rate (RBER) according to a number of embodiments of the present disclosure.

FIG. 4 is a plot illustrating average iterations of layered iterative error correction versus raw bit error rate (RBER) according to a number of embodiments of the present disclosure. The RBER closer to the right of the graph can be representative of a typical RBER at the beginning of life for a typical memory device. FIG. 4 illustrates experimental data indicating iterations savings for an iterative error correction circuit (e.g., LDPC decoder) for various threshold numbers of parity errors (PE) according to a number of embodiments of the present disclosure. For example, as illustrated in FIG. 4, successfully decoding a codeword using only a LDPC decoder without exiting a layer if a second error correction circuit (e.g., an algebraic error correction circuit) can error correct any residual errors may require an average of 3.2 iterations at RBER=3E-3 and an average of 1.8 iterations at RBER=1E-3. Table 1 shows an average iteration savings according to a number of embodiments of the present disclosure.

TABLE 1

Average Iteration Savings (RBER ≤ 3E−3)

| PE = 0 | PE ≤ 3 | PE ≤ 10 |
|---|---|---|
| 0.79 | 1.08 | 1.40 |

For example, as compared to LDPC decoding using only a LDPC decoder without exiting a layer if a second error correction circuit (e.g., an algebraic error correction circuit) can error correct any residual errors, an average iteration savings of 1.08 iterations can be achieved with a threshold number of parity errors of three (PE≤3), which can represent three or fewer parity errors in a layer of a codeword. A number of embodiments in accordance with the present disclosure can save at least three layers from having to be decoded with a LDPC decoder (an average iteration savings of 0.75 iterations) regardless of the RBER such that there can be a 25% average iteration savings at RBER=3E-3 and a 40% average iteration savings at RBER=1E-3.

CONCLUSION

The present disclosure includes apparatuses and methods related to layer-by-layer error correction for more efficient use of the algebraic error correction circuit and the iterative error correction circuit. The algebraic error correction circuit, in general, uses less energy to correct errors than the iterative error correction circuit. A number of methods can include receiving a codeword with a first error correction circuit, iteratively error correcting the codeword on a layer-by-layer basis with the first error correction circuit in a first mode, and determining on the layer-by-layer basis whether a number of parity errors in a particular layer is less than a threshold number of parity errors. Methods can include transferring the codeword to a second error correction circuit in response to the number of parity errors in the particular layer being less than the threshold number of parity errors and iteratively error correcting the codeword with the first error correction circuit in a second mode in response to the number of parity errors in the particular layer being greater than the threshold number of parity errors.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus for multi-stage error correction, comprising:
   a first error correction circuit, wherein, in a first mode, the first error correction circuit is configured to:
      determine whether an initial number of parity errors of a first codeword comprising hard data is less than a threshold number of parity errors;
      transfer the first codeword to a second error correction circuit in response to the initial number of parity errors being less than the threshold; and
      enter a second mode in response to the initial number of parity errors not being less than the threshold;
   wherein, in the second mode, the first error correction circuit is configured to:
      iteratively error correct the first codeword in a low-effort mode on a layer-by-layer basis, wherein a layer comprises a fraction of an iteration;
      determine whether, after the iterative error correction in the low-effort mode, the first codeword is correctable by the second error correction circuit;

transfer the first codeword to the second error correction circuit in response to a determination that the first codeword is correctable by the second error correction circuit;
continue iteratively error correcting the first codeword in the low-effort mode in response to a determination that the first codeword is not correctable by the second error correction circuit and in response to fewer than a first number of iterations being completed by the first error correction circuit; and
enter a third mode in response to the determination that the first codeword is not correctable by the second error correction circuit and in response to at least the first number of iterations being completed by the first error correction circuit;
wherein, in the third mode, the first error correction circuit is configured to:
iteratively error correct the first codeword in a high-effort mode on a layer-by-layer basis;
determine whether, after the iterative error correction in the high-effort mode, the first codeword is correctable by the second error correction circuit;
transfer the first codeword to the second error correction circuit in response to a determination that the first codeword is correctable by the second error correction circuit after the error correction in the high-effort mode; and
enter a fourth mode in response to the determination that the first codeword is not correctable by the second error correction circuit after the error correction in the high-effort mode;
wherein, in the fourth mode, the first error correction circuit is configured to:
cause a second codeword, including soft data, corresponding to the first codeword to be read from a memory device;
iteratively error correct the second codeword in the high-effort mode on a layer-by-layer basis;
determine whether, after the iterative error correction in the high-effort mode, the second codeword is correctable by the second error correction circuit; and
transfer the second codeword to the second error correction circuit in response to a determination that the second codeword is correctable by the second error correction circuit.

2. The apparatus of claim 1, wherein the threshold number of parity errors is at least partially based on an adjustable code rate of the first error correction circuit or the second error correction circuit.

3. The apparatus of claim 1, wherein the low-effort mode includes a first set of parameters for a min-sum algorithm; and
wherein the high-effort mode includes a second set of parameters for the min-sum algorithm different than the first set of parameters.

4. The apparatus of claim 1, wherein the first error correction circuit is further configured to stop iterative error correcting the codeword without error correcting a next layer of a particular iteration in response to transferring the codeword to the second error correction circuit.

5. The apparatus of claim 1, wherein the first error correction circuit is further configured to autonomously transfer the codeword to the second error correction circuit.

6. The apparatus of claim 1, wherein the threshold number of parity errors is at least partially based on a correction capability of the second error correction circuit.

7. The apparatus of claim 1, wherein the first error correction circuit is configured to decode a quasi-cyclic low density parity check (LDPC) code, and
wherein the second error correction circuit is configured to decode an algebraic code.

8. A apparatus, comprising:
a memory device; and
a first error correction circuit coupled to the memory device and, in a first mode, configured to:
determine whether an initial number of parity errors of a first codeword comprising hard data is less than a threshold number of parity errors;
transfer the first codeword to a second error correction circuit in response to the initial number of parity errors being less than the threshold; and
enter a second mode in response to the initial number of parity errors not being less than the threshold;
wherein, in the second mode, the first error correction circuit is configured to:
iteratively error correct the first codeword in a low-effort mode on a layer-by-layer basis, wherein a layer comprises a fraction of an iteration;
determine whether, after the iterative error correction in the low-effort mode, the first codeword is correctable by the second error correction circuit;
transfer the first codeword to the second error correction circuit in response to a determination that the first codeword is correctable by the second error correction circuit;
continue iteratively error correcting the first codeword in the low-effort mode in response to a determination that the first codeword is not correctable by the second error correction circuit and in response to fewer than a first number of iterations being completed by the first error correction circuit; and
enter a third mode in response to the determination that the first codeword is not correctable by the second error correction circuit and in response to at least the first number of iterations being completed by the first error correction circuit;
wherein, in the third mode, the first error correction circuit is configured to:
iteratively error correct the first codeword in a high-effort mode on a layer-by-layer basis;
determine whether, after the iterative error correction in the high-effort mode, the first codeword is correctable by the second error correction circuit;
transfer the first codeword to the second error correction circuit in response to a determination that the first codeword is correctable by the second error correction circuit after the error correction in the high-effort mode; and
enter a fourth mode in response to the determination that the first codeword is not correctable by the second error correction circuit after the error correction in the high-effort mode;
wherein, in the fourth mode, the first error correction circuit is configured to:
cause a second codeword, including soft data, corresponding to the first codeword to be read from a memory device;
iteratively error correct the second codeword in the high-effort mode on a layer-by-layer basis;
determine whether, after the iterative error correction in the high-effort mode, the second codeword is correctable by the second error correction circuit; and transfer the second codeword to the second error correction circuit in response to a determination that the second codeword is correctable by the second error correction circuit.

9. The apparatus of claim 8, further comprising a controller coupled to the first error correction circuit and configured to adjust a code rate of the first error correction circuit.

10. The apparatus of claim 9, wherein the controller is coupled to the second error correction circuit and further configured to adjust a code rate of the second error correction circuit such that a subsequently encoded codeword comprises:
a first parity overhead corresponding to the first error correction circuit; and
a second parity overhead corresponding to the second error correction circuit.

11. The apparatus of claim 8, wherein the second error correction circuit is further configured to error correct the codeword in response to the second layer including less than the threshold number of parity errors.

12. The apparatus of claim 8, wherein the second error correction circuit is further configured to begin error correcting the codeword in response to the first error correction circuit stopping iteratively error correcting the codeword.

13. An apparatus, comprising:
a memory device;
a first error correction circuit coupled to the memory device, wherein the first error correction circuit, in a first mode, is configured to:
  determine whether an initial number of parity errors of a first codeword comprising hard data is less than a threshold number of parity errors;
  transfer the first codeword to a second error correction circuit in response to the initial number of parity errors being less than the threshold; and
  enter a second mode in response to the initial number of parity errors not being less than the threshold;
wherein, in the second mode, the first error correction circuit is configured to:
  iteratively error correct the first codeword in a low-effort mode on a layer-by-layer basis, wherein a layer comprises a fraction of an iteration;
  determine whether, after the iterative error correction in the low-effort mode, the first codeword is correctable by the second error correction circuit;
  transfer the first codeword to the second error correction circuit in response to a determination that the first codeword is correctable by the second error correction circuit;
  continue iteratively error correcting the first codeword in the low-effort mode in response to a determination that the first codeword is not correctable by the second error correction circuit and in response to fewer than a first number of iterations being completed by the first error correction circuit; and
  enter a third mode in response to the determination that the first codeword is not correctable by the second error correction circuit and in response to at least the first number of iterations being completed by the first error correction circuit;
wherein, in the third mode, the first error correction circuit is configured to:
  iteratively error correct the first codeword in a high-effort mode on a layer-by-layer basis;
  determine whether, after the iterative error correction in the high-effort mode, the first codeword is correctable by the second error correction circuit;
  transfer the first codeword to the second error correction circuit in response to a determination that the first codeword is correctable by the second error correction circuit after the error correction in the high-effort mode; and
  enter a fourth mode in response to the determination that the first codeword is not correctable by the second error correction circuit after the error correction in the high-effort mode;
wherein, in the fourth mode, the first error correction circuit is configured to:
  cause a second codeword, including soft data, corresponding to the first codeword to be read from a memory device;
  iteratively error correct the second codeword in the high-effort mode on a layer-by-layer basis;
  determine whether, after the iterative error correction in the high-effort mode, the second codeword is correctable by the second error correction circuit; and
  transfer the second codeword to the second error correction circuit in response to a determination that the second codeword is correctable by the second error correction circuit
the second error correction circuit coupled to the first error correction circuit, wherein the second error correction circuit is configured to:
  receive the codeword from the first error correction circuit; and
  error correct the codeword; and
a controller coupled to the first error correction circuit and configured to adjust a code rate of the first error correction circuit at least partially based on a technology node comprising at least one of a feature size, a type of the memory device, a performance characteristic of the memory device or a reliability characteristic of the memory device.

14. The apparatus of claim 13, wherein the first error correction circuit is further configured to, in response to the second error correction circuit reporting an uncorrectable error, continue iteratively error correcting the codeword until the codeword is successfully error corrected or a maximum number of iterations of error correction has been performed.

15. The apparatus of claim 13, wherein the first error correction circuit is further configured to switch from the first mode to the second mode via hardware only.

* * * * *